United States Patent
Yu et al.

(10) Patent No.: US 10,433,413 B2
(45) Date of Patent: Oct. 1, 2019

(54) MANUFACTURING METHOD OF CIRCUIT STRUCTURE EMBEDDED WITH HEAT-DISSIPATION BLOCK

(71) Applicant: Unimicron Technology Corp., Taoyuan (TW)

(72) Inventors: Cheng-Po Yu, Taoyuan County (TW); Ming-Chia Li, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 766 days.

(21) Appl. No.: 14/460,365

(22) Filed: Aug. 15, 2014

(65) Prior Publication Data

US 2016/0050771 A1    Feb. 18, 2016

(51) Int. Cl.
*H05K 3/30*  (2006.01)
*H05K 1/02*  (2006.01)
(Continued)

(52) U.S. Cl.
CPC .......... *H05K 1/0204* (2013.01); *H05K 1/021* (2013.01); *H05K 1/183* (2013.01); *H05K 3/4602* (2013.01);
(Continued)

(58) Field of Classification Search
CPC ....... H05K 3/4697; H05K 3/4038–429; H05K 3/4644–4682; H05K 1/0204;
(Continued)

(56) References Cited

U.S. PATENT DOCUMENTS

| 4,246,595 | A | * | 1/1981 | Noyori | ................ | G02F 1/13452 |
| | | | | | | 257/668 |
| 4,711,804 | A | * | 12/1987 | Burgess | ............... | H05K 1/0271 |
| | | | | | | 174/16.3 |

(Continued)

FOREIGN PATENT DOCUMENTS

| TW | 430959 | 4/2001 |
| TW | 200908267 | 2/2009 |
| TW | M458758 | 8/2013 |

OTHER PUBLICATIONS

"Office Action of Taiwan Counterpart Application", dated Aug. 26, 2015, p. 1-p. 8.

*Primary Examiner* — Peter Dungba Vo
*Assistant Examiner* — Kaying Kue
(74) *Attorney, Agent, or Firm* — JCIPRNET

(57) ABSTRACT

A manufacturing method of circuit structure embedded with heat-dissipation block including the following steps is provided. A core board including a first dielectric layer and two first conductive layers located on two opposite sides of the first dielectric layer is provided. A through hole penetrated the core board is formed. A heat-dissipation block is disposed into the through hole. Two inner-layer circuits are formed on two opposite sides of the core board. At least one build-up structure is bonded on the core board, wherein the build-up structure includes a second dielectric layer and a second conductive layer, and the second dielectric layer is located between the second conductive layer and the core board. A cavity is formed on a predetermined region of the build-up structure, and the cavity is communicated with the corresponding inner-layer circuit. Another manufacturing method of circuit structure embedded with heat-dissipation block is also provided.

3 Claims, 9 Drawing Sheets

(51) Int. Cl.
*H05K 3/40* (2006.01)
*H05K 1/18* (2006.01)
*H05K 3/46* (2006.01)

(52) U.S. Cl.
CPC ............... *H05K 2201/066* (2013.01); *H05K 2201/09845* (2013.01); *H05K 2201/10416* (2013.01)

(58) Field of Classification Search
CPC .... H05K 1/021; H05K 1/0203; H05K 1/0201; H05K 1/183; H05K 3/4602; H05K 2201/066; H05K 2201/09845; H05K 2201/10416; Y10T 29/4913–49146
USPC ............ 29/831, 832–841; 438/122; 174/252, 174/547, 548
See application file for complete search history.

(56) References Cited

U.S. PATENT DOCUMENTS

| | | | | |
|---|---|---|---|---|
| 5,285,352 A * | 2/1994 | Pastore | ............... | H01L 23/36 165/185 |
| 5,352,926 A * | 10/1994 | Andrews | ............... | H01L 23/34 257/717 |
| 5,661,902 A * | 9/1997 | Katchmar | ............... | H01L 23/3672 174/252 |
| 6,407,363 B2 * | 6/2002 | Dunsky | ............... | B23K 26/02 219/121.71 |
| 6,459,585 B1 * | 10/2002 | Bergstedt | ............... | H05K 1/0204 165/80.3 |
| 6,803,257 B2 * | 10/2004 | Lee | ............... | H01L 23/3128 257/E23.062 |
| 6,818,477 B2 * | 11/2004 | Veitschegger | ............... | H05K 1/0204 29/832 |
| 6,820,328 B2 * | 11/2004 | Barcley | ............... | H05K 1/0206 174/16.3 |
| 6,825,108 B2 * | 11/2004 | Khan | ............... | H01L 21/4857 257/734 |
| 6,861,750 B2 * | 3/2005 | Zhao | ............... | H01L 23/3677 257/666 |
| 7,334,323 B2 * | 2/2008 | Egitto | ............... | H05K 3/4069 156/252 |
| 7,339,118 B1 * | 3/2008 | Takada | ............... | H01L 23/49822 174/255 |
| 7,506,435 B2 * | 3/2009 | Hung | ............... | H05K 1/185 29/825 |
| 7,508,079 B2 * | 3/2009 | Higashi | ............... | H01L 21/486 257/774 |
| 7,685,707 B2 * | 3/2010 | Nishii | ............... | H05K 3/462 156/273.9 |
| 7,748,111 B2 * | 7/2010 | Wang | ............... | H01L 21/4857 29/830 |
| 7,774,932 B2 * | 8/2010 | Chen | ............... | H05K 3/205 174/262 |
| 7,849,594 B2 * | 12/2010 | Wang | ............... | H05K 1/186 29/825 |
| 8,122,598 B2 * | 2/2012 | Yokomaku | ............... | H05K 1/141 228/180.22 |
| 8,166,650 B2 * | 5/2012 | Thomas | ............... | H05K 1/0206 228/180.22 |
| 8,314,346 B2 * | 11/2012 | Hasegawa | ............... | H01L 33/642 174/252 |
| 8,391,011 B2 * | 3/2013 | Mori | ............... | H01L 23/3735 165/104.33 |
| 2005/0194575 A1 * | 9/2005 | Satou | ............... | H01B 1/16 252/500 |
| 2008/0153324 A1 * | 6/2008 | Hsu | ............... | H01L 23/5389 439/74 |
| 2013/0170136 A1 | 7/2013 | Roby | | |
| 2013/0269986 A1 * | 10/2013 | Sun | ............... | H01L 23/3677 174/252 |

* cited by examiner

MANUFACTURING METHOD OF CIRCUIT STRUCTURE EMBEDDED WITH HEAT-DISSIPATION BLOCK

BACKGROUND OF THE INVENTION

Field of the Invention

The invention relates to a manufacturing method of a circuit structure, and more particularly, relates to a manufacturing method of a circuit structure embedded with heat-dissipation block.

Description of Related Art

In recent years, for expanding applications of a printed circuit board (PCB), many technologies have been proposed to manufacture the printed circuit board in a multilayer circuit structure in order to increase spaces inside the multilayer circuit structure for circuit layout. A manufacturing method of the multilayer circuit structure includes repeatedly bonding and stacking build-up structures composed of a copper foil and a prepreg (pp) on a core board to increase internal circuit layout spaces in the multilayer circuit structure, and filling conductive materials into blind holes of each of the build-up structures by utilizing an electroplating process in order to conduct through each layer. In addition, various different components (e.g., chips, connectors, optoelectronic components or heat-dissipation components, etc.) may also be disposed in the circuit structure based on demands, so as to increase functionality of the circuit structure.

Take an electronic component (e.g., a chip) disposed in the circuit structure for example, because the electronic component will generate heat during operation, a heat-dissipation block is usually further disposed in the circuit structure for transferring heat energy to the outside of the circuit structure. Further, in order to provide better heat dissipation efficiency, a heat sink may also be disposed in the circuit structure to assist in heat-dissipation. In the conventional manufacturing method of circuit structure embedded with heat-dissipation block, the heat-dissipation block is generally embedded into a through hole penetrated the circuit structure only after a completed circuit structure is formed by bonding the build-up structures on the core board. Accordingly, a dimension of the heat-dissipation block is greater to cause increases in required manufacturing costs, and a heat-dissipation path of the heat-dissipation block is also longer. In addition, because the components (e.g., the electronic component, and the heat sink, etc.) are usually directly disposed on an outer surface of the circuit structure and connected to the heat-dissipation block, an assembly thickness may become thicker after aforesaid components are assembled into the circuit structure, which is disadvantageous in miniaturization of the circuit structure.

SUMMARY OF THE INVENTION

The invention is directed to a manufacturing method of circuit structure embedded with heat-dissipation block, and capable of reducing manufacturing costs of the circuit structure while shortening heat-dissipation path of the circuit structure as well as reducing the assembly thickness of the circuit structure.

A manufacturing method of circuit structure embedded with heat-dissipation block includes the following steps. A core board is provided, wherein the core board includes a first dielectric layer and two first conductive layers, and the two first conductive layers are located on two opposite sides of the first dielectric layer, respectively. A through hole penetrated the core board is formed. A heat-dissipation block is disposed into the through hole. Two inner-layer circuits are formed on two opposite sides of the core board. At least one build-up structure is bonded on the core board, wherein the build-up structure includes a second dielectric layer and a second conductive layer, and the second dielectric layer is located between the second conductive layer and the core board. A cavity is formed on a predetermined region of the build-up structure, wherein the cavity is communicated with the corresponding inner-layer circuit and corresponding to the heat-dissipation block.

A manufacturing method of circuit structure embedded with heat-dissipation block includes the following steps. A core board is provided, wherein the core board includes a first dielectric layer and two first conductive layers, and the two first conductive layers are located on two opposite sides of the first dielectric layer, respectively. Two inner-layer circuits are formed on two opposite sides of the core board. At least one build-up structure is bonded on the core board, wherein the build-up structure includes a second dielectric layer and a second conductive layer, and the second dielectric layer is located between the second conductive layer and the core board. A cavity is formed on a predetermined region of the build-up structure, and the cavity is communicated with the corresponding inner-layer circuit. A through hole penetrated the core board is formed. A heat-dissipation block is disposed into the cavity, wherein the cavity is corresponding to the heat-dissipation block.

In an embodiment of the invention, a dimension of the cavity is greater than a dimension of the through hole.

In an embodiment of the invention, the manufacturing method of circuit structure embedded with heat-dissipation block further includes the following step. Before the step of bonding the build-up structure on the core board, a release film is disposed on the core board, wherein the release film is corresponding to the predetermined region of the build-up structure. In the step of forming the cavity on the predetermined region of the build-up structure, the predetermined region of the build-up structure and the release film are removed, so as to form the cavity on the build-up structure.

In an embodiment of the invention, a dimension of the heat-dissipation block is smaller than the dimension of the through hole.

In an embodiment of the invention, the manufacturing method of circuit structure embedded with heat-dissipation block further includes the following step. A chip is disposed into the cavity, wherein the chip is electrically connected to the corresponding inner-layer circuit; or a heat sink is disposed into the cavity, wherein the heat sink is connected to the heat-dissipation block.

Based on above, the manufacturing method of circuit structure embedded with the heat-dissipation block of the invention is provided, in which the heat-dissipation block is disposed into the through hole penetrated the core board, the cavity is disposed on the build-up structure bonded on the core board, and the cavity is communicated with the core board and corresponding to the heat-dissipation block. Accordingly, as in comparison with the conventional manufacturing method in which the heat-dissipation block is embedded in the entire circuit structure, the manufacturing method of the circuit structure embedded with heat-dissipation block of the invention is capable of reducing manufacturing costs of the circuit structure while shortening heat-dissipation path of the circuit structure as well as reducing the assembly thickness of the circuit structure in which other components are assembled.

To make the above features and advantages of the disclosure more comprehensible, several embodiments accompanied with drawings are described in detail as follows.

DESCRIPTION OF THE EMBODIMENTS

Figure 1A:
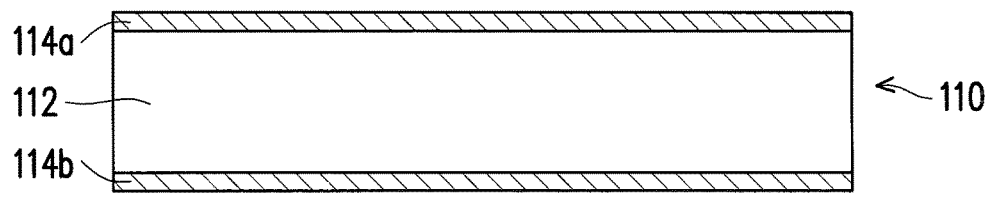
FIG. 1A to FIG. 1H are schematic diagrams for manufacturing a circuit structure embedded with heat-dissipation block according to an embodiment of the invention.
Figure 1B:
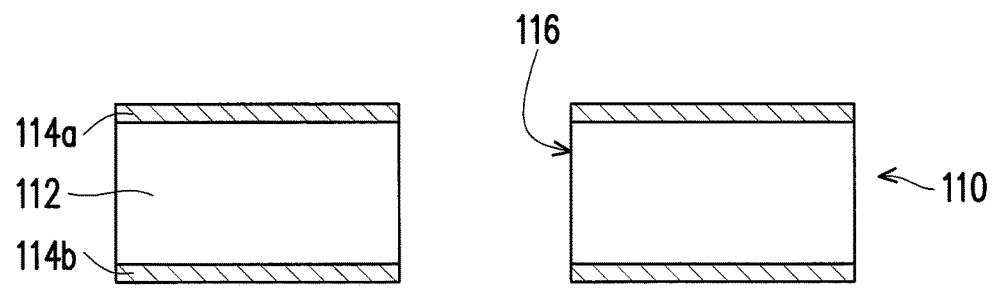
Figure 1C:
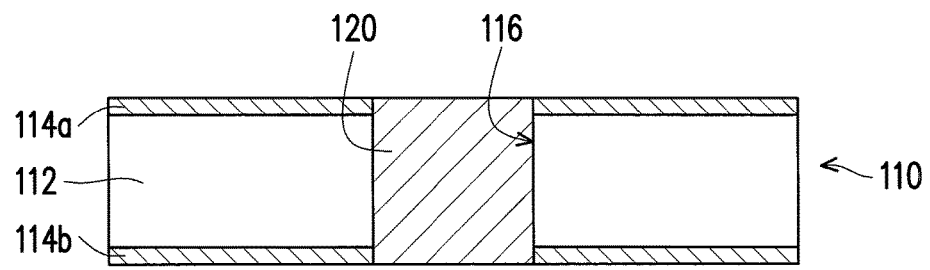
Figure 1D:
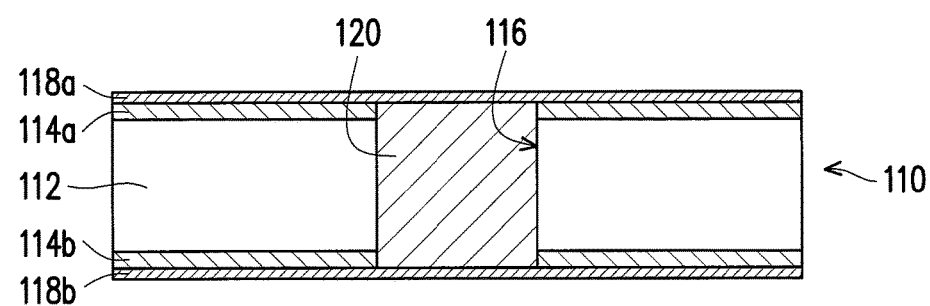
Figure 1E:
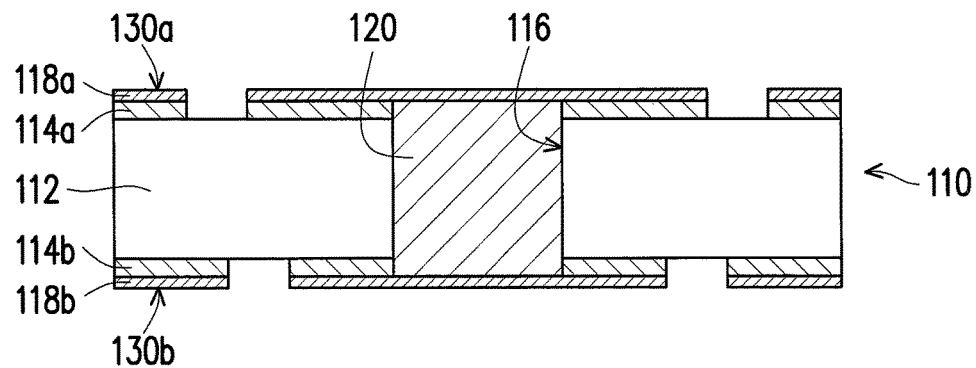
Figure 1F:
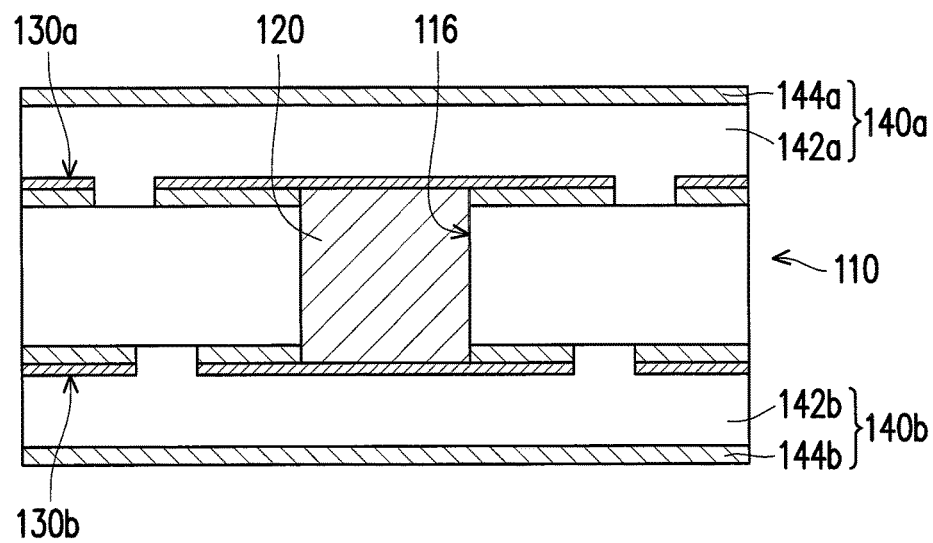

FIG. 1A to FIG. 1H are schematic diagrams for manufacturing a circuit structure embedded with heat-dissipation block according to an embodiment of the invention. Referring to FIG. 1A to FIG. 1H, in the present embodiment, a manufacturing method of a circuit structure 100 embedded with heat-dissipation block (illustrated in FIG. 1H) includes the following steps. In step S110, a core board 110 is provided. In step S120, a through hole 116 penetrated the core board 110 is formed. In step S130, a heat-dissipation block 120 is disposed into the through hole 116. In step S140, two inner-layer circuits 130a and 130b are formed on two opposite sides of the core board 110. In step S150, build-up structures 140a and 140b are bonded on the core board 110. In step S160, a cavity 146a is formed on a predetermined region 148a of the build-up structure 140a, and a cavity 146b is formed on a predetermined region 148b of the build-up structure 140b, wherein the cavity 146a is communicated with the corresponding inner-layer circuit 130a, the cavity 146b is communicated with the corresponding inner-layer circuit 130b, and the cavities 146a and 146b are corresponding to the heat-dissipation block 120. Above steps are described below in texts by reference with FIG. 1A to FIG. 1H.

First, in step S110, the core board 110 is provided. Specifically, please referring to FIG. 1A, in the present embodiment, the core board 110 includes a first dielectric layer 112 and two first conductive layers 114a and 114b, and the two first conductive layers 114a and 114b are located on two opposite sides of the first dielectric layer 112, respectively. A material of the first dielectric layer 112 is, for example, a prepreg (pp) or other applicable dielectric materials, and a material of the first conductive layers 114a and 114b is, for example, a copper foil or other applicable conductive materials. Therefore, the core board 110 may adopt a copper clad laminate (CCL) or a substrate with above composition. However, the type of the core board 110 and the materials and the forming method of the first dielectric layer 112, the first conductive layers 114a and 114b are not particularly limited in the invention and may be adjusted on demands.

Next, in step S120, the through hole 116 penetrated the core board 110 is formed. Specifically, please referring to FIG. 1B, in the present embodiment, the through hole 116 is formed on the core board 110 and penetrates the core board 110. The step of forming the through hole 116 may include a mechanical drill process, a laser drill process or other applicable processes, but the method of forming the through hole 116 is not particularly limited in the invention.

Next, in step S130, the heat-dissipation block 120 is disposed into the through hole 116. Specifically, please referring to FIG. 1C, in the present embodiment, a material of the heat-dissipation block 120 is a metal, and more preferably, a metal with good heat dissipation, such as copper. However, the material of the heat-dissipation block 120 is not particularly limited in the invention. Further, in the present embodiment, a dimension of the heat-dissipation block 120 is smaller than a dimension of the through hole 116. More specifically, the dimension of the heat-dissipation block 120 is slightly smaller than the dimension of the through hole 116 and a dimension scale of the two is, for example, between 0.8 to 1, but the actual dimensions may be adjusted on demands. Accordingly, the heat-dissipation block 120 may be smoothly filled into the through hole 116, and the heat-dissipation block 120 may be in contact with an inner surface of the through hole 116 to be positioned inside the through hole 116. Accordingly, in the present embodiment, the heat-dissipation block 120 may be fixed inside the through hole 116 without using additional adhesion layers.

Next, after the step of disposing the heat-dissipation block 120 into the through hole 116 (step S130), and before the step of forming the two inner-layer circuits 130a and 130b on the two opposite sides of the core board 110, respectively (step S140), conductive materials 118a and 118b are disposed on the first conductive layers 114a and 114b, respectively. Specifically, please referring to FIG. 1D, in the present embodiment, the conductive materials 118a and 118b may be, for example, copper or other applicable conductive materials, and the conductive materials 118a and 118b are formed on the first conductive layers 114a and 114b and covering the heat-dissipation block 120 through an electroplating process or other applicable processes. Further, conductive holes (not illustrated) may be disposed on the core board 110 in advance, and the conductive materials 118a and 118b may be filled into the conductive holes and electrically connected to each other. Accordingly, the two first conductive layers 114a and 114b respectively located on the two opposite sides of the first dielectric layer 112 may be electrically connected to each other through the conductive materials 118a and 118b and the conductive holes. However, the material and the forming method of conductive materials 118a and 118b and whether to dispose them are not particularly limited in the invention and may be adjusted on demands.

Next, in step S140, the two inner-layer circuits 130a and 130b are formed on the two opposite sides of the core board 110. Specifically, please referring to FIG. 1E, in the present embodiment, the first conductive layer 114a of the core board 110 and the conductive material 118a disposed thereon may be patterned according to desired circuit layout, so as to form the inner-layer circuit 130a. Therein, the step of patterning the first conductive layer 114a and the conductive material 118a includes, for example, an etching process or other applicable processes, so that the inner-layer circuit 130a may include conductive patterns and wires which are connected to one another. Similarly, the first conductive layer 114b of the core board 110 and the conductive material 118b disposed thereon may be patterned according to desired circuit layout, so as to form the inner-layer circuit 130b which includes conductive patterns and wires which are connected to one another. Further, since the heat-dissipation block 120 of the present embodiment adopts the metal, the heat-dissipation block 120 may also include electrical conductivity in addition to good heat dissipation. Accordingly, the inner-layer circuits 130a and 130b may be electrically connected to each other through the heat-dissipation block 120, or electrically connected to each other through the conductive materials 118a and 118b filled in aforesaid conductive holes.

In addition, the manufacturing method of the circuit structure 100 embedded with the heat-dissipation block 120 of the present embodiment may be done in the following sequence. First, the through hole 116 is formed (step S120). Next, the heat-dissipation block 120 is disposed into the through hole 116 (step S130). Thereafter, the two inner-layer circuits 130a and 130b are formed (step S140). However, in other embodiments which are not illustrated, the manufacturing method of the circuit structure 100 embedded with the heat-dissipation block 120 may also be done in the following sequence. First, the through hole 116 is formed (step S120). Next, the two inner-layer circuits 130a and 130b are formed (step S140). Thereafter, the heat-dissipation block 120 is disposed into the through hole 116 (step S130). Alternatively, the manufacturing method of the circuit structure 100 embedded with the heat-dissipation block 120 may also be done in the following sequence. First, the two inner-layer circuits 130a and 130b are formed (step S140). Next, the through hole 116 is formed (step S120). Thereafter, the heat-dissipation block 120 is disposed into the through hole 116 (step S130). In other words, whether to form the through hole 116 (step S120) first or to form the two inner-layer circuits 130a and 130b (step S140) first are not particularly limited in the invention and may be adjusted on demands. Nonetheless, if the through hole 116 is formed and the heat-dissipation block 120 is disposed before forming the two inner-layer circuits 130a and 130b in the present embodiment, the inner-layer circuits 130a and 130b may be prevented from damages during the process of disposing the through hole 116 and the heat-dissipation block 120.

Next, in step S150, the build-up structures 140a and 140b are bonded on the core board 110. Specifically, please referring to FIG. 1F, in the present embodiment, a quantity of the build-up structures (140a and 140b) are two for example, and the build-up structures 140a and 140b are disposed on the two opposite sides of the core board 110, respectively. However, the quantity of the build-up structures (140a and 140b) is not particularly limited in the invention and may be adjusted on demands. The build-up structure 140a includes a second dielectric layer 142a and a second conductive layer 144a, wherein the second dielectric layer 142a is located between the second conductive layer 144a and the core board 110 and covering the inner-layer circuit 130a. Similarly, the build-up structure 140b includes a second dielectric layer 142b and a second conductive layer 144b, wherein the second dielectric layer 142b is located between the second conductive layer 144b and the core board 110 and covering the inner-layer circuit 130b. Furthermore, a material of the second dielectric layers 142a and 142b is, for example, a prepreg (pp) or other applicable dielectric materials, and a material of the second conductive layers 144a and 144b is, for example, a copper foil or other applicable conductive materials. Nevertheless, the invention is not limited to aforesaid implementation.

Figure 1G:
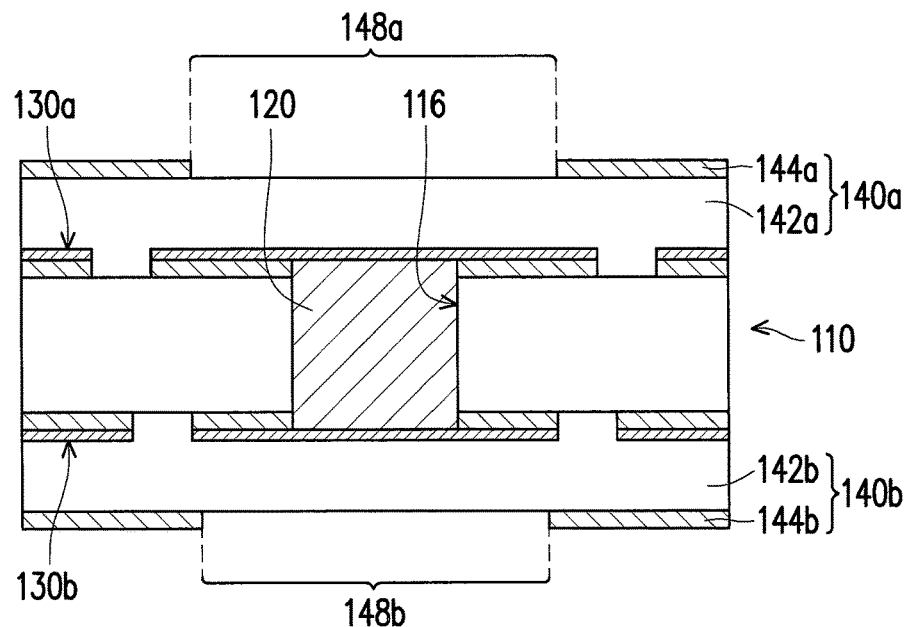
Figure 1H:
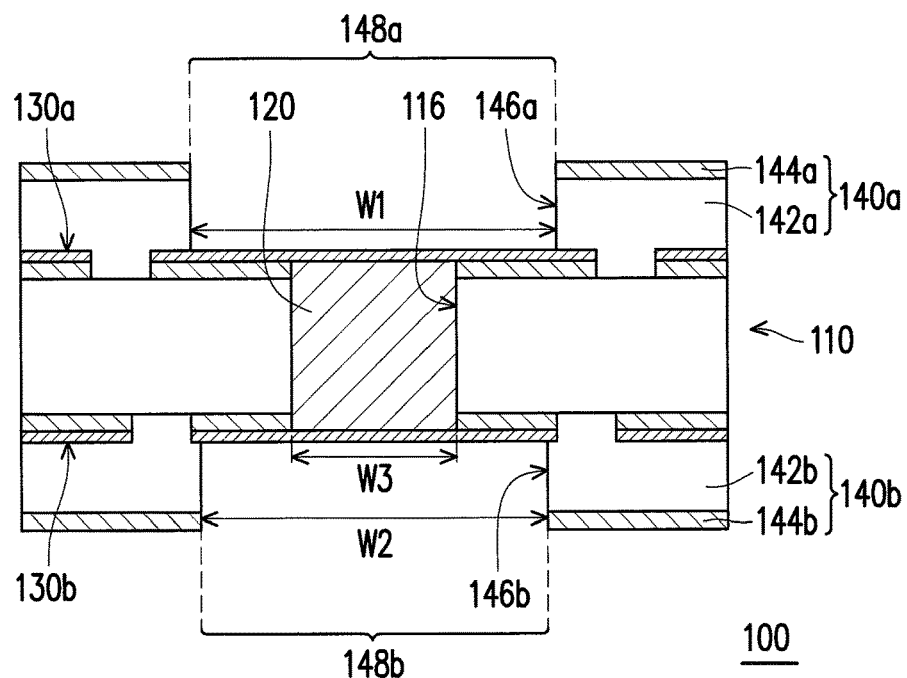

Lastly, in step S160, the cavity 146a is formed on the predetermined region 148a of the build-up structure 140a, and the cavity 146b is formed on the predetermined region 148b of the build-up structure 140b, wherein the cavity 146a is communicated with the corresponding inner-layer circuit 130a, the cavity 146b is communicated with the corresponding inner-layer circuit 130b, and the cavities 146a and 146b are corresponding to the heat-dissipation block 120. Specifically, please referring to FIG. 1G and FIG. 1H, in the present embodiment, the cavity 146a penetrates the corresponding build-up structure 140a to be communicated with the corresponding inner-layer circuit 130a, and the cavity 146b penetrates the corresponding build-up structure 140b to be communicated with the corresponding inner-layer circuit 130b. Since each of the build-up structures (140a, 140b) includes the second dielectric layer (142a, 142b) and the second conductive layer (144a, 144b), and the material of the second dielectric layer (142a, 142b) is different from the material of the second conductive layer (144a, 144b), each of the cavities 146a and 146b may be formed on corresponding one of the build-up structures 140a and 140b respectively by using two processes. First, as shown in FIG. 1G, a portion of the second conductive layer 144a corresponding to the predetermined region 148a is removed, and a portion of the second conductive layer 144b corresponding to the predetermined region 148b is removed. The predetermined regions 148a and 148b may be regarded as regions for correspondingly forming the cavities 146a and 146b on the build-up structures 140a and 140b, respectively. Further, the step of removing the portions of the second conductive layers 144a and 144b includes a laser drilling process or other applicable processes, but the invention is not limited thereto. Thereafter, as shown in FIG. 1H, a portion of the second dielectric layer 142a corresponding to the predetermined region 148a is removed, and a portion of the second dielectric layer 142b corresponding to the predetermined region 148b is removed. Similarly, the step of removing the portions of the second dielectric layers 142a and 144b includes a laser drilling process or other applicable processes, but the invention is not limited thereto. Accordingly, the cavities 146a and 146b may be correspondingly formed at the portions of the build-up structures 140a and 140b being removed (i.e., the predetermined regions 148a and 148b). At this point, the manufacturing method of the circuit structure 100 embedded with the heat-dissipation block 120 of the present embodiment is initially completed.

In addition, in step S160, the steps of forming the cavity 146a on the predetermined region 148a of the build-up structure 140a and forming the cavity 146b on the predetermined region 148b of the build-up structure 140b are completed by removing the portions of the build-up structures 140a and 140b (including the second conductive layers 144a and 144b and the second dielectric layers 142a and 142b) corresponding to the predetermined regions 148a and 148b. Accordingly, in order to simplify the step of removing the portions of the build-up structures 140a and 140b, in the present embodiment, the manufacturing method of the circuit structure 100 embedded with the heat-dissipation block 120 further includes the following steps. Before the step of bonding the build-up structures 140a and 140b on the core board 110 (step S150), release films (not illustrated) are disposed on the core board 110, wherein the release films are corresponding to the predetermined regions 148a and 148b of the build-up structures 140a and 140b, respectively. In other words, in the present embodiment, before the step of bonding the build-up structures 140a and 140b on the core board 110 (step S150), one release film is disposed between the core board 110 and the predetermined region 148a of the build-up structure 140a, and another release film is disposed between the core board 110 and the predetermined region 148b of the build-up structure 140b. A projected area of the release film on the core board 110 is substantially equal to a projected area of the predetermined region (148a, 148b) on the core board 110. Thereafter, in the step of bonding the build-up structures 140a and 140b on the core board 110 (step S150), the portions of the build-up structures 140a and 140b corresponding to the predetermined regions 148a and 148b are disposed on the release films. Accordingly, in the steps of forming the cavity 146a on the predetermined region 148a of the build-up structure 140a and forming the cavity 146b on the predetermined region 148b of the build-up structure 140b (step S160), the predetermined regions 148a and 148b of the build-up structures 140a and 140b may be removed together with the corresponding release films. Yet, other portions of the build-up structures 140a and 140b not in contact with the release films are still disposed on the core board 110 and covering the corresponding inner-layer circuits 130a and 130b. In addition, since the present embodiment is described by using two build-up structures 140a and 140b as example, two release films are adopted accordingly in the present embodiment. However, in other embodiments in which only one build-up structure is disposed, a quantity of the release films may also be adjusted to correspondingly, and the invention is not limited thereto.

Figure 2:
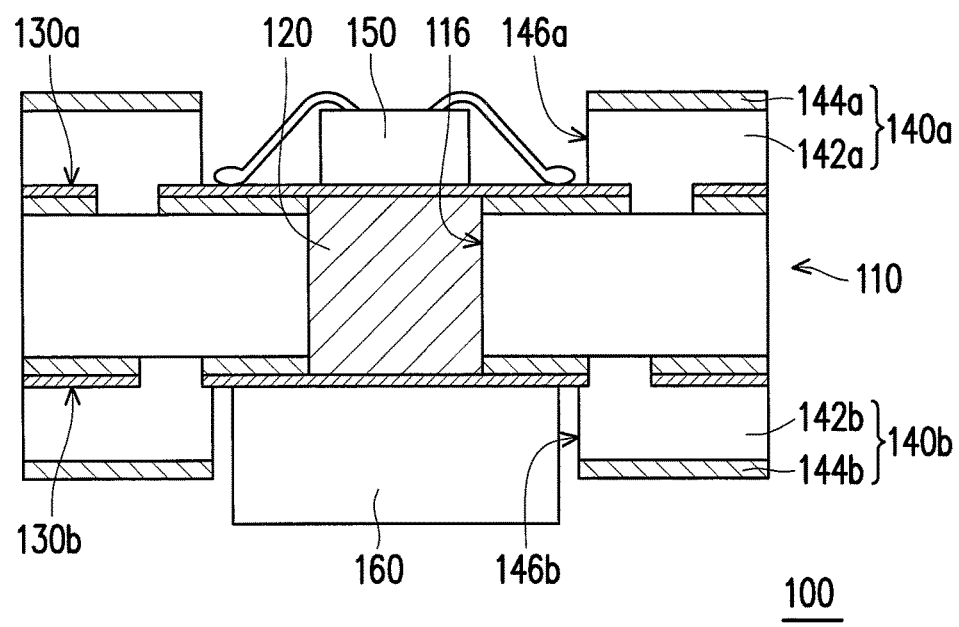
FIG. 2 is a schematic diagram illustrating the circuit structure embedded with heat-dissipation block of FIG. 1H in which other components are assembled.

FIG. 2 is a schematic diagram illustrating the circuit structure embedded with heat-dissipation block of FIG. 1H in which other components are assembled. Referring to FIG. 2, in the present embodiment, applicable electronic components (e.g., a chip 150) may be further disposed in the circuit structure 100 embedded with the heat-dissipation block 120 based on demands, so as to increase functionality of the circuit structure 100 embedded with the heat-dissipation block 120. In addition, in the embodiments in which the chip 150 or other electronic components are disposed, a heat sink 160 may also be disposed in the circuit structure 100 embedded with the heat-dissipation block 120 based on demands, so as increase a heat dissipation efficiency of the circuit structure 100 embedded with the heat-dissipation block 120. Specifically, in the present embodiment, dimensions of the cavities 146a and 146b (e.g., represented by widths W1 and W2, respectively) are greater than the dimension of the through hole 116 (e.g., represented by a width W3), and a dimension scale of the cavities and the through hole is, for example, between 1.5 to 2, but the actual dimensions may be adjusted on demands. Accordingly, the chip 150, the heat sink 160 or other applicable components may be disposed into the cavities 146a and 146b, and connected to the circuit structure 100 embedded with the heat-dissipation block 120.

More specifically, in the present embodiment, the manufacturing method of the circuit structure 100 embedded with the heat-dissipation block 120 further includes the following steps. The chip 150 is disposed into the cavity 146a, and the chip 150 is electrically connected to the corresponding inner-layer circuit 130a; and the heat sink 160 is disposed into the cavity 146b, and the heat sink 160 is connected to the heat-dissipation block 120. In other words, since there are two cavities 146a and 146b included in the circuit structure 100 embedded with the heat-dissipation block 120, two components may be disposed based on demands (e.g., the chip 150 and the heat ink 160 as adopted in the present embodiment). However, the type of the components disposed in the cavities 146a and 146b is not particularly limited in the invention, and whether the chip 150 and the heat sink 160 are disposed is not particularly limited either. Since the chip 150 is disposed into the cavity 146a and electrically connected to the inner-layer circuit 130a located on the core board 110, heat energy generated by the chip 150 during operation may be transferred to another side of the core board 110 through the heat-dissipation block 120 with good heat dissipation. In addition, since the heat sink 160 is disposed on the cavity 146b in the present embodiment, heat energy generated by the chip 150 may further be transferred to the outside of the core board 110 through the heat sink 160 after being transferred to the another side of the core board 110 through the heat-dissipation block 120 with good heat dissipation. Accordingly, the circuit structure 100 embedded with the heat-dissipation block 120 is capable of providing better heat dissipation efficiency.

Furthermore, unlike the conventional manufacturing method in which the heat-dissipation block is disposed in the entire circuit structure, the heat-dissipation block 120 of the present embodiment is only disposed on the core board 110, so that a length of the heat-dissipation block can be substantially equal to a thickness of the core board 110. Accordingly, the manufacturing method of the circuit structure 100 embedded with the heat-dissipation block 120 is capable of reducing manufacturing costs of the circuit structure 100 while shortening heat-dissipation path of the circuit structure 100. In addition, unlike the conventional manufacturing method in which the components (e.g., the chip and the heat sink) are directly disposed on an outer surface of the circuit structure, the chip 150 and the heat sink 160 are respectively disposed into the cavities 146a or 146b in the present embodiment. Accordingly, the manufacturing method of the circuit structure 100 embedded with the heat-dissipation block 120 is capable of reducing an assembly thickness of the circuit structure 100.

FIG. 3A to FIG. 3G are schematic diagrams for manufacturing a circuit structure embedded with heat-dissipation block according to another embodiment of the invention. Referring to FIG. 3A to FIG. 3G, in the present embodiment, a manufacturing method of a circuit structure 100a embedded with heat-dissipation block (illustrated in FIG. 3G) includes the following steps. In step S210, a core board 110 is provided. In step S220, two inner-layer circuits 130a and 130b are formed on two opposite sides of the core board 110. In step S230, build-up structures 140a and 140b are bonded on the core board 110. In step S240, a cavity 146a is formed on a predetermined region 148a of the build-up structure 140a, and a cavity 146b is formed on a predetermined region 148b of the build-up structure 140b, wherein the cavity 146a is communicated with the corresponding inner-layer circuit 130a, and the cavity 146b is communicated with the corresponding inner-layer circuit 130b. In step S250, a through hole 116 penetrated the core board 110 is formed. In step S260, a heat-dissipation block 120 is disposed into the through hole 116, and the cavities 146a and 146b are corresponding to the heat-dissipation block 120. Above steps are described below in texts by reference with FIG. 3A to FIG. 3G.

First, in step S210, the core board 110 is provided. Specifically, please referring to FIG. 3A, in the present embodiment, the core board 110 includes a first dielectric layer 112 and two first conductive layers 114a and 114b, and the two first conductive layers 114a and 114b are located on two opposite sides of the first dielectric layer 112, respectively. Implementation regarding the core board 110 may refer to the description for aforesaid step S110, which is not repeated hereinafter.

Figure 3A:
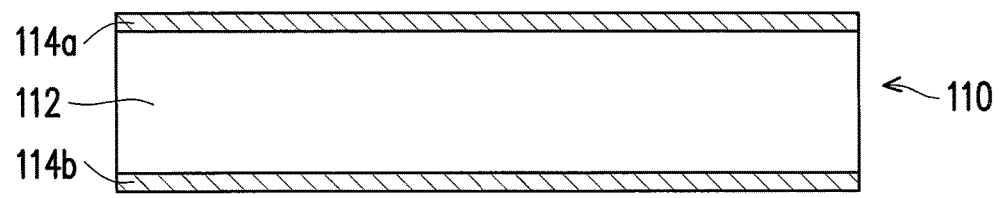
FIG. 3A to FIG. 3G are schematic diagrams for manufacturing a circuit structure embedded with heat-dissipation block according to another embodiment of the invention.
Figure 3B:
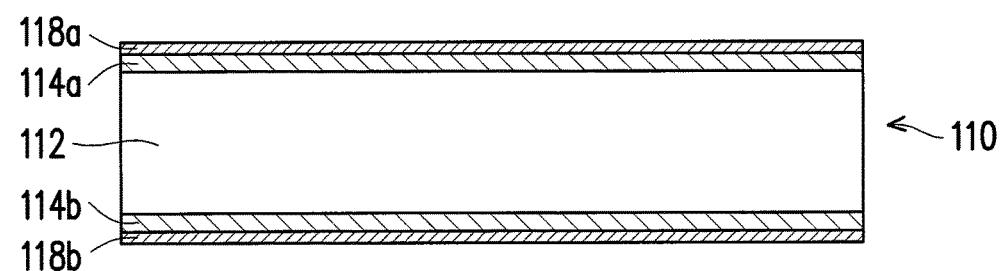
Figure 3C:
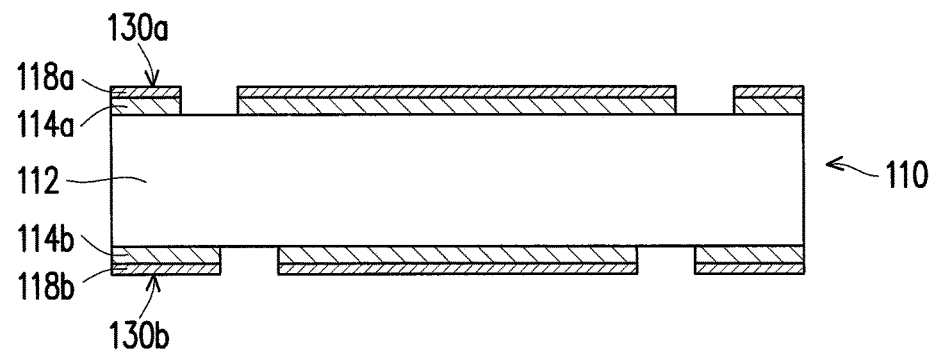
Figure 3D:
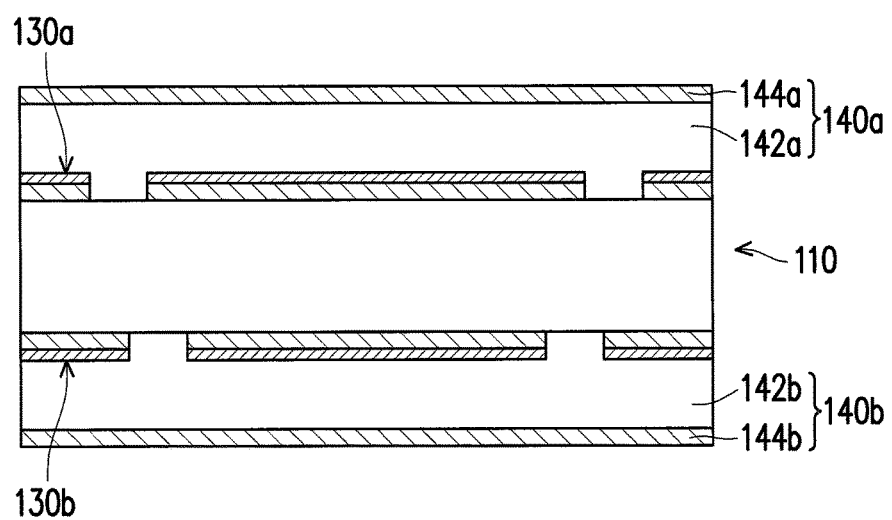
Figure 3E:
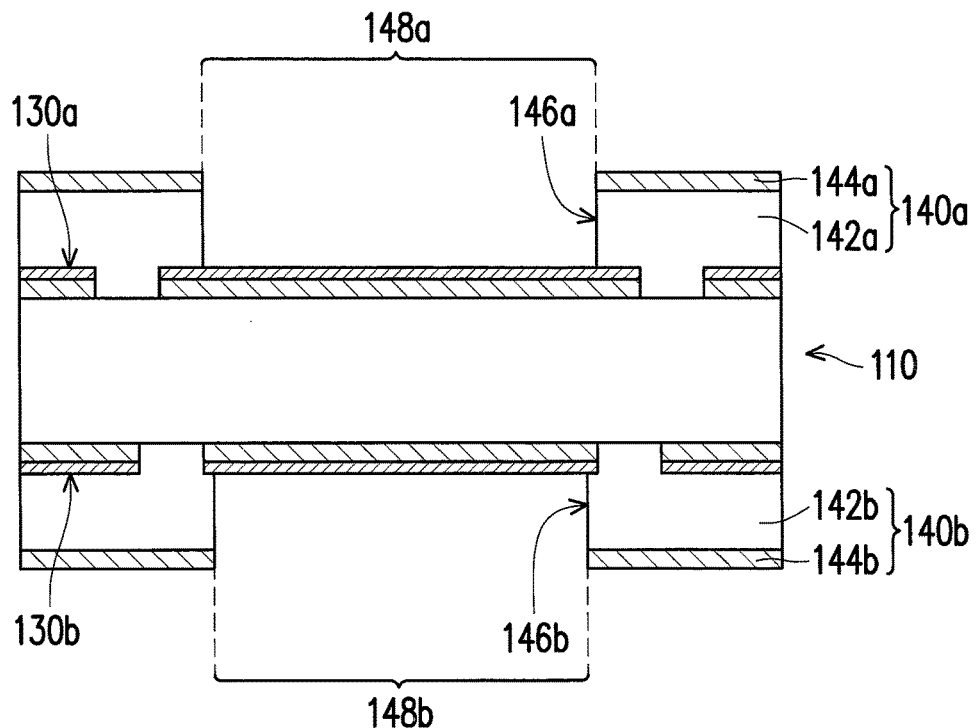
Figure 3F:
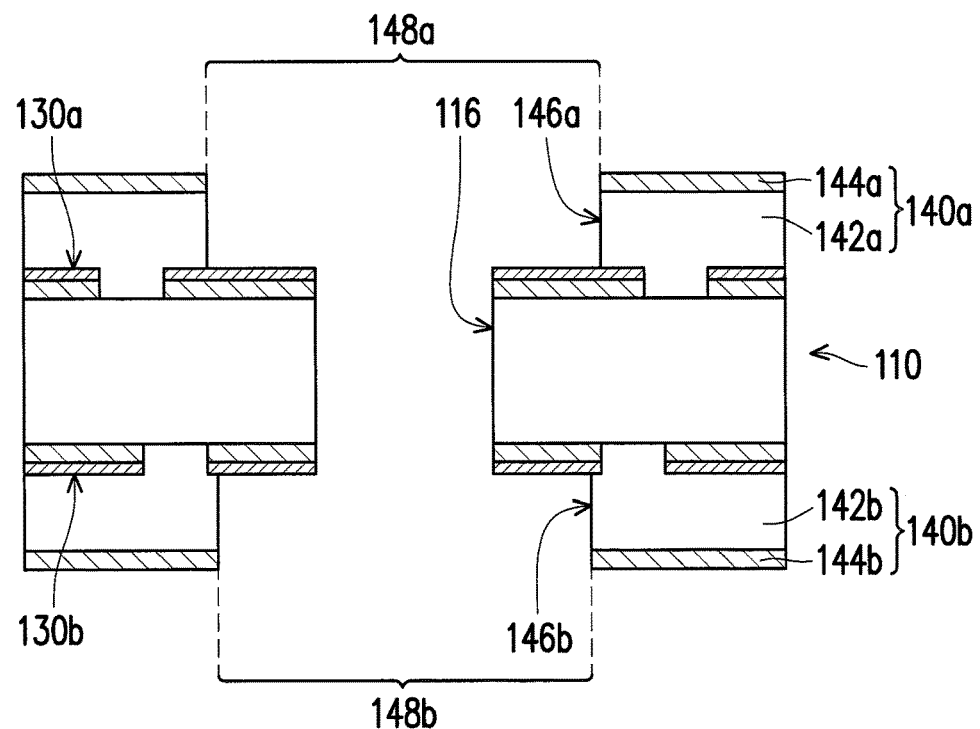
Figure 3G:
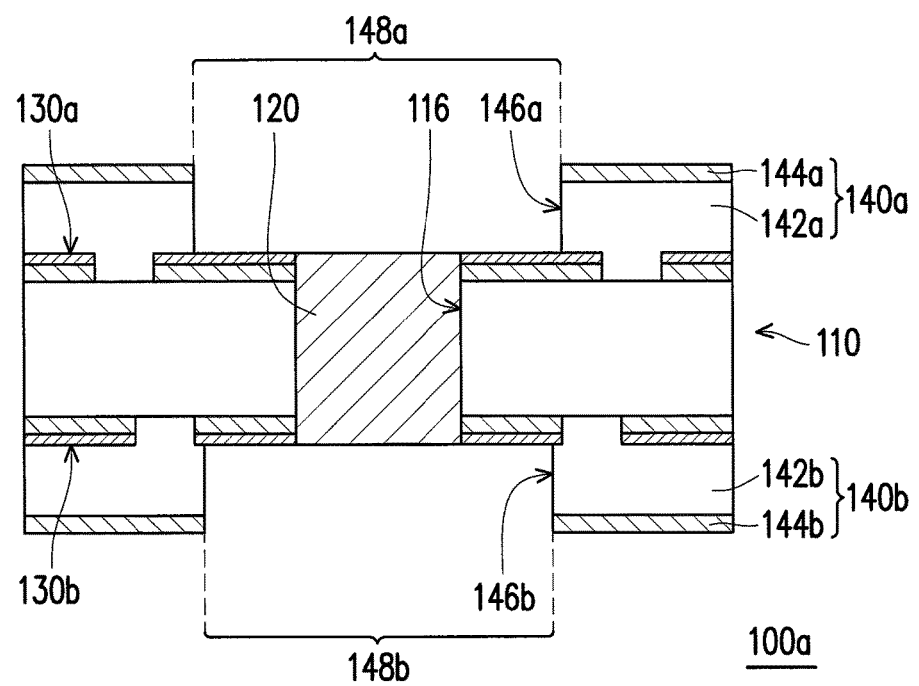

Next, in step S220, the two inner-layer circuits 130a and 130b are formed. Specifically, please referring to FIG. 3B and FIG. 3C, in the present embodiment, before the step of forming the two inner-layer circuits 130a and 130b on the two opposite sides of the core board 110, respectively (step S220), conductive materials 118a and 118b are disposed on the first conductive layers 114a and 114b, respectively (as shown in FIG. 3B). The conductive materials 118a and 118b may be, for example, copper or other applicable conductive materials, and formed on the first conductive layers 114a and 114b through an electroplating process or other applicable processes. In addition, conductive holes (not illustrated) may also be disposed on the core board 110, and the conductive materials 118a and 118b may be filled into the conductive holes, so that the subsequently formed inner-layer circuits 130a and 130b may be electrically connected to each other. Thereafter, in step S220, the two first conductive layers 114a and 114b and the conductive materials 118a and 118b disposed thereon may be patterned according to desired circuit layout through an etching process or other applicable processes, so as to form the two inner-layer circuits 130a and 130b (as shown in FIG. 3C) by the two first conductive layers 114a and 114b and the conductive materials 118a and 118b. Implementation regarding the inner-layer circuits 130a and 130b may refer to the descriptions for FIG. 1D to FIG. 1E and step S140, which are not repeated hereinafter.

Next, in step S230, the build-up structures 140a and 140b are bonded on the core board 110. Specifically, please referring to FIG. 3D, in the present embodiment, a quantity of the build-up structures (140a and 140b) are two for example, and the build-up structures 140a and 140b are disposed on the two opposite sides of the core board 110, respectively. However, the quantity of the build-up structures (140a and 140b) is not particularly limited in the invention. The build-up structure 140a includes a second dielectric layer 142a and a second conductive layer 144a, wherein the second dielectric layer 142a is located between the second conductive layer 144a and the core board 110 and covering the inner-layer circuit 130a. Similarly, the build-up structure 140b includes a second dielectric layer 142b and a second conductive layer 144b, wherein the second dielectric layer 142b is located between the second conductive layer 144b and the core board 110 and covering the inner-layer circuit 130b. Implementation regarding the build-up structures 140a and 140b may refer to the descriptions for FIG. 1F and step S150, which are not repeated hereinafter.

Next, in step S240, the cavity 146a is formed on the predetermined region 148a of the build-up structure 140a, and the cavity 146b is formed on the predetermined region 148b of the build-up structure 140b, wherein the cavity 146a is communicated with the corresponding inner-layer circuit 130a, and the cavity 146b is communicated with the corresponding inner-layer circuit 130b. Specifically, please referring to FIG. 3E, in the present embodiment, the steps of forming the cavity 146a on the predetermined region 148a of the build-up structure 140a and forming the cavity 146b on the predetermined region 148b of the build-up structure 140b are completed by removing the portions of the build-up structures 140a and 140b (including the second conductive layers 144a and 144b and the second dielectric layers 142a and 142b) corresponding to the predetermined regions 148a and 148b, so as to form the cavities 146a and 146b. Therein, the cavity 146a penetrates the corresponding build-up structure 140a to be communicated with the corresponding inner-layer circuit 130a, and the cavity 146b penetrates the corresponding build-up structure 140b to be communicated with the corresponding inner-layer circuit 130b. In addition, the step of removing the portions of the second conductive layers 144a and 144b and the step of removing the portions of the second dielectric layers 142a and 142b may be executed by using two processes, respectively, so as to correspondingly form the cavities 146a and 146b on the predetermined regions 148a and 148b of the build-up structures 140a and 140b. In addition, in order to simplify the steps of forming the cavities 146a and 146b, release films (not illustrated) may be disposed on the core board 110 in advance, so that the portions of the build-up structures 140a and 140b corresponding to the predetermined regions 148a and 148b may be bonded on the release films. Accordingly, in the step of forming the cavities 146a and 146b (step S240), the predetermined regions 148a and 148b of the build-up structures 140a and 140b may be removed together with the release films. Yet, other portions of the build-up structures 140a and 140b not in contact with the release films are still disposed on and covering the corresponding inner-layer circuits 130a and 130b. The forming method regarding the cavities 146a and 146b may refer to the descriptions for FIG. 1G and FIG. 1H and step S160, which are not repeated hereinafter.

Next, in step S250, the through hole 116 penetrated the core board 110 is formed. Specifically, please referring to FIG. 3F, in the present embodiment, the through hole 116 is formed on the core board 110. The step of forming the through hole 116 may include a mechanical drill process, a laser drill process or other applicable processes, but the method of forming the through hole 116 is not particularly limited in the invention. Moreover, in the present embodiment, the through hole 116 is corresponding to the cavities 146a and 146b and communicated with the cavities 146a and 146b. Further, dimensions of the cavities 146a and 146b are greater than the dimension of the through hole 116, and the dimension scale of the cavities and the through hole is, for example, between 1.5 to 2. However, the invention is not limited to the above, and the actual dimensions may be adjusted on demands. The forming method regarding the through hole 116 may refer to the descriptions for FIG. 1B and step S120, which are not repeated hereinafter.

Lastly, in step S260, the heat-dissipation block 120 is disposed into the through hole 116, and the cavities 146a and 146b are corresponding to the heat-dissipation block 120. Specifically, please referring to FIG. 3G, in the present embodiment, a material of the heat-dissipation block 120 is a metal, and more preferably, a metal with good heat dissipation, such as copper. Further, the dimension of the heat-dissipation block 120 is slightly smaller than the dimension of the through hole 116, and the dimension scale of the two is, for example, between 0.8 to 1. However, the invention is not limited to the above, and the material and the dimension of the heat-dissipation block 120 may be adjusted on demands. Since the dimension of the heat-dissipation block 120 is slightly smaller than the dimension of the through hole 116, the heat-dissipation block 120 may be smoothly filled into the through hole 116, and in contact with an inner surface of the through hole 116 to be positioned inside the through hole 116. Accordingly, in the present embodiment, the heat-dissipation block 120 may be fixed inside the through hole 116 without using additional adhesion layers. The disposing method regarding the heat-dissipation block 120 may refer to the descriptions for FIG. 1C and step S130, which are not repeated hereinafter. At this point, the manufacturing method of the circuit structure 100a embedded with the heat-dissipation block 120 of the present embodiment is initially completed. Unlike the conventional manufacturing method in which the heat-dissipation block is disposed in the entire circuit structure, the heat-dissipation block 120 of the present embodiment is only disposed on the core board 110. Accordingly, the manufacturing method of the circuit structure 100a embedded with the heat-dissipation block 120 is capable of reducing manufacturing costs of the circuit structure 100a while shortening heat-dissipation path of the circuit structure 100a.

In view of above, a major difference between the manufacturing method of the circuit structure 100a embedded with the heat-dissipation block 120 of the present embodiment (step S210 to step S260) and the manufacturing method of the circuit structure 100 embedded with the heat-dissipation block 120 of the previous embodiment (step S110 to step S160) is the sequence of the steps. Accordingly, the circuit structure 100a of the present embodiment and the circuit structure 100 of the previous embodiment include similar structure and effectiveness. In addition, the chip 150 and the heat sink 160 may also be disposed in the circuit structure 100a embedded with the heat-dissipation block 120 of the present embodiment as similarly to that of the circuit structure 100 embedded with the heat-dissipation block 120 depicted in FIG. 2, and related contents of the above may refer to FIG. 2 and its related description. However, whether to dispose the chip 150 and the heat sink 160 is not particularly limited in the invention. Accordingly, unlike the conventional manufacturing method in which the components (e.g., the chip and the heat sink) are directly disposed on an outer surface of the circuit structure, the chip 150 and the heat sink 160 of the present embodiment are respectively disposed into the cavities 146a or 146b. Therefore, the manufacturing method of the circuit structure 100a embedded with the heat-dissipation block 120 is capable of reducing an assembly thickness of the circuit structure 100a.

Furthermore, in the present embodiment, the through hole 116 is formed on the core board 110 only after the inner-layer circuits 130a and 130b are formed. Therefore, the heat-dissipation block 120 disposed in the through hole 116 is communicated with the cavities 146a and 146b, and the chip 150 and the heat sink 160 subsequently assembled in the cavities 146a and 146b may be in contact with the heat-dissipation block 120 directly, so that heat energy generated by the chip 150 during operation may be directly transferred to the heat sink 160 through the heat-dissipation block 120, and then transferred to the outside of the core board 110 through the heat sink 160. On the other hand, in the previous embodiment, the through hole 116 is already formed on the core board 110 before the inner-layer circuits 130a and 130b are formed. Therefore, the inner-layer circuits 130a and 130b partially cover on the heat-dissipation block 120 located in the through hole 116, and the chip 150 and the heat sink 160 subsequently assembled in the cavities 146a and 146b are disposed on the corresponding inner-layer circuits 130a and 130b. However, a structural difference as described above does not affect heat dissipation functions of the circuit structures 100 and 100a, and thus the manufacturing methods of the circuit structures 100 and 100a embedded with the heat-dissipation block 120 may be adjusted on demands.

In addition, the previous embodiments take the heat-dissipation block 120 embedded in the core board 110 as examples. Nevertheless, the invention is not limited to above-said embodiments. In other embodiments which are not illustrated, a plurality of build-up structures may be disposed in the circuit structure embedded with the heat-dissipation block. For example, more than two build-up structures may be disposed on each of the two opposite sides of the core board. In this case, other than penetrating the core board, the through hole may also be extended to the build-up structures located in inner layers. On the other hand, the cavity is only disposed on the build-up structures located in outer layers. Accordingly, a depth of the through hole is equal to a total thickness of the core board and the build-up structures located in the inner layers. Therefore, the through hole may be used together with the heat-dissipation block having a length being longer in order to provide a longer heat-dissipation path for the circuit structure. As a result, the purpose of embedding the heat-dissipation block and disposing the cavity in the circuit structure may also be achieved. Thus, it can be known that, the length of the heat-dissipation block and the depth of the through hole may be adjusted on demands, and the dimensions of the cavities are greater than the dimension of the through hole so that components such as the chip and the heat sink may be disposed in the cavities.

In summary, the manufacturing method of the circuit structure embedded with the heat-dissipation block according to the invention includes disposing the through hole on the core board, and disposing the cavity on the build-up structure bonded on the core board, wherein the heat-dissipation block is disposed into the through hole, and the cavity is communicated with the core board. Accordingly, as in comparison with the conventional manufacturing method in which the heat-dissipation block is embedded in the entire circuit structure, the manufacturing method of the circuit structure embedded with heat-dissipation block of the invention is capable of reducing manufacturing costs of the circuit structure while shortening heat-dissipation path of the circuit structure. In addition, the chip or the heat sink may also be disposed in the circuit structure embedded with the heat-dissipation block, and the chip or the heat sink is disposed into the cavity. Accordingly, as in comparison with the conventional manufacturing method in which the chip or the heat sink is directly disposed on the outer surface of the circuit structure, the manufacturing method of the circuit structure embedded with heat-dissipation block of the invention is capable of reducing the assembly thickness of the circuit structure in which other components are assembled.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of circuit structure embedded with heat-dissipation block, comprising:
   providing a core board, wherein the core board comprises a first dielectric layer and two first conductive layers, and the two first conductive layers are located on two opposite sides of the first dielectric layer, respectively;
   forming two inner-layer circuits on two opposite sides of the core board;
   bonding two build-up structures on two opposite sides of the core board, wherein each of the build-up structures comprises a second dielectric layer and a second conductive layer, and the second dielectric layer is located between the second conductive layer and the core board;
   forming a cavity on a predetermined region of each of the two build-up structures, wherein the cavity is communicated with the corresponding inner-layer circuit;
   forming a through hole penetrated the core board after forming the cavity and bonding the build-up structures, wherein a dimension of the cavity is greater than a dimension of the through hole, and the through hole is communicated with the cavity, and wherein the cavities of the two build-up structures have an overlapping area, the through hole is formed at the overlapping area and communicated with the cavities; and
   disposing a heat-dissipation block into the through hole, wherein the through hole is corresponding to the heat-dissipation block, an upper surface and a lower surface of the heat-dissipation block are aligned with two opening ends of the through hole, respectively.

2. The manufacturing method of circuit structure embedded with heat-dissipation block of claim 1, further comprising:
before the step of bonding the build-up structure on the core board, disposing a release film on the core board, wherein the release film is corresponding to the predetermined region of the build-up structure; and in the step of forming the cavity on the predetermined region of the build-up structure, removing the predetermined region of the build-up structure and the release film, so as to form the cavity on the build-up structure.

3. The manufacturing method of circuit structure embedded with heat-dissipation block of claim 1, further comprising:
disposing a chip into the cavity, wherein the chip is electrically connected to the corresponding inner-layer circuit; or disposing a heat sink into the cavity, wherein the heat sink is connected to the heat-dissipation block.

* * * * *